(12) United States Patent
Greco et al.

(10) Patent No.: US 7,081,583 B2
(45) Date of Patent: Jul. 25, 2006

(54) DIGITALLY CONTROLLABLE OSCILLATOR

(75) Inventors: Patrizia Greco, St. Magdalen (AT);
Andreas Steinschaden, Riegersdorf (AT); Edwin Thaller, Faak/See (AT); Gernot Zessar, Kreuth (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/166,685

(22) Filed: Jun. 23, 2005

(65) Prior Publication Data
US 2006/0021491 A1  Feb. 2, 2006

Related U.S. Application Data

(63) Continuation of application No. PCT/EP03/014816, filed on Dec. 23, 2003.

(30) Foreign Application Priority Data
Dec. 23, 2002  (DE) ................. 102 60 713

(51) Int. Cl.
*G10H 5/00*   (2006.01)
(52) U.S. Cl. ........................... 84/647
(58) Field of Classification Search .......... 84/600–603, 84/609, 615, 647–649, 653, 671
See application file for complete search history.

(56) References Cited

U.S. PATENT DOCUMENTS 4,568,888 A   2/1986  Kimura et al.
6,411,237 B1  6/2002  Lautzenhiser
6,605,769 B1* 8/2003  Juszkiewicz ............. 84/609
6,989,484 B1* 1/2006  Gross ....................... 84/609

FOREIGN PATENT DOCUMENTS

EP   0 402 113 A2   12/1990
EP   0 824 290 A1    2/1998

OTHER PUBLICATIONS

Hwang, In-Chul et al.; "A Digitally Controlled Phase-Locked Loop With a Digital Phase-Frequency Detector for Fast Acquisition"; IEEE Journal of Solid-Sate Circuits, vol. 36, No. 10, Oct. 2001, pp. 1574-1581.

Xu, Xiaofeng et al.; The Implementation of Dual-Truncation $\Sigma\Delta$ D/A Converters; Circuits and Systems, 1992.; ISCAS '92.; Proceedings., 1992 IEEE International Symposium in San Diego, CA, US, May 10-13, 1992, vol. 2, pp. 597-600.

* cited by examiner

*Primary Examiner*—Kimberly Lockett
(74) *Attorney, Agent, or Firm*—Dickstein, Shapiro, Morin & Oshinsky, LLP (57) ABSTRACT

A digitally controllable oscillator includes an oscillation generation means and an oscillator control, wherein the oscillator control comprises two digital/analog converters whose output signals are combined by a combiner in order to generate an analog input signal into the oscillation generation means. The second digital/analog converter is implemented in order to provide, in response to a digital increment in its digital input signal, a difference in the output signal of the second digital/analog converter which is smaller than a difference in the output signal of the first digital/analog converter when the first digital/analog converter is pulsed with the digital increment in its digital input signal.

24 Claims, 8 Drawing Sheets

DIGITALLY CONTROLLABLE OSCILLATOR

CROSS-REFERENCE TO RELATED APPLICATIONS

This application is a continuation of co-pending International Application No. PCT/EP2003/014816, filed Dec. 23, 2003, which designated the United States and was not published in English.

BACKGROUND OF THE INVENTION

1. Field of the Invention

The present invention relates to controllable oscillators and in particular to digitally controllable oscillators usable for clock extraction, clock recovery, synchronization, etc., within or outside a phase lodge loop.

2. Description of the Related Art

In data transmission technology there is a general need for extracting a clock from a data stream. A data transmission standard which recently spread increasingly is the USB standard (USB=universal serial bus). The USB standard standardizes a data transmission format for a fast data transmission between USB devices and a host. The USB standard defines a so-called tier-star-topology, wherein USB devices may either be hubs or functions or functional devices, respectively. The USB data format is specified in the USB specification. The most current USB definition is currently USB revision 2.0.

The USB bus is a semi-duplex bus. All transactions are initiated by the host. In the USB specification revision 2.0 three data transmission rates are defined. The lowest data transmission rate is used in the low-speed mode and comprises 1.5 megabits per second. In the full-speed mode a data transmission rate of 12 megabits per second is used.

In the high-speed mode a data transmission rate of 480 megabits per second is used.

The use of the low-speed mode serves for interactive devices, like e.g. a keyboard or a mouse. Only a limited number of low-speed devices should be connected to the bus in order to prevent a degradation of the bus efficiency. For full-speed and high-speed devices a special bandwidth and latency are guaranteed.

Devices are connected to the USB bus via a 4-wire cable, carrying differential data, a power signal and mass. This means, that one core of the 4-wire cables carries a positive differential signal Dp, that a further core of the 4-wire cables carries a negative differential signal Dn and that a further core is on the supply potential and that finally the last core is on the mass potential. The clock information is encoded in the data. According to the USB specification an NRZI encoding and a bit stuffing technology are used in order to guarantee an adequate number of transitions. NRZI means no return to zero invert. This means, that an inverse encoding is used. A logical "1" signal is represented by a non-present change in an electrical signal, while a logical "0" signal is represented by a change of state of the electrical signal. One edge thus represents a zero, while a non-present change, i.e. a steady-state signal, represents a zero. Further, for a steady component reduction a bit stuffing is used, so that after six subsequent ones a positive/negative edge is used.

Figure 7A:
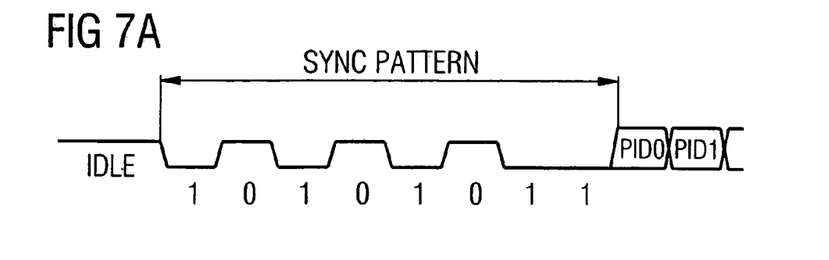
FIG. 7a shows a section of the data stream including the synchronization pattern and a subsequent PID pattern.
Figure 7B:
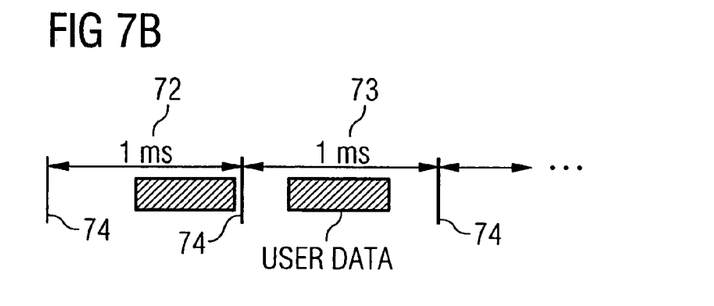
FIG. 7b shows an illustration of the organization of the data stream in frames.
Figure 7C:
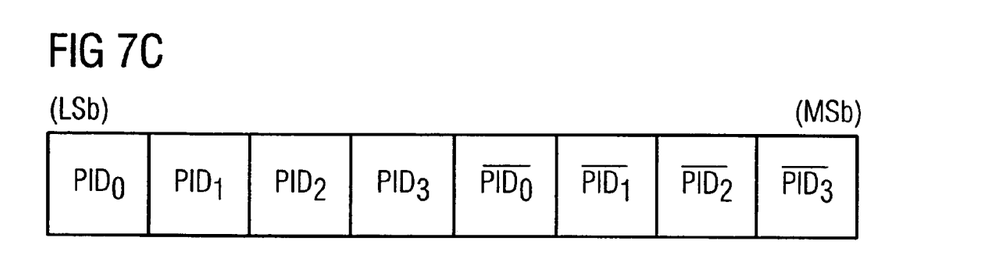
FIG. 7c shows an illustration of the PID contained within the data stream according to the USB standard.

As it is illustrated in FIG. 7b, the data stream is defined as a series of frames 72, 73, which are separated from each other by so-called control characters 74, wherein the ticks occur at an interval of 1 ms. Within the frame 72 or 73 a plurality of data packets is located. This means that a frame consists of several data packets and that a data stream consists of a plurality of subsequent frames. Each data packet is introduced in the data stream by a packet identification number having a width of 8 bits and illustrated in FIG. 7c. One frame thus includes as many packet identification numbers (PID) as there are packets in the frame. The specification of the packet identification number illustrated in FIG. 7c which is four bits wide and presented in a PID field by the four PID bits $PID_0$, $PID_1$, $PID_2$, $PID_3$ and by the correspondingly inverted PID bits, is determined in the USB standard. The bits represented in FIG. 7c are arranged from the LSb to the MSb. LSb stands for least significant bit, while MSb stands for most significant bit.

Figure 7D:
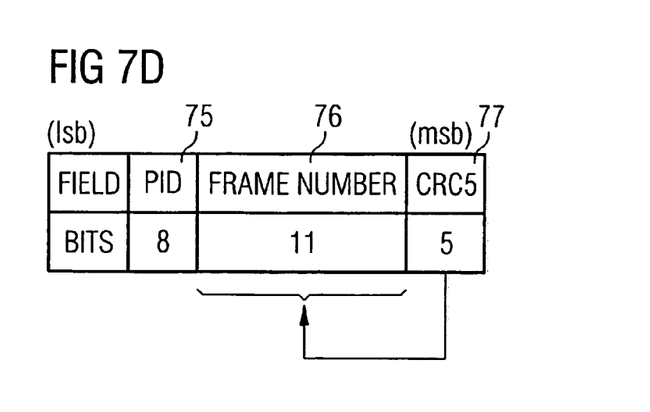
FIG. 7d shows an illustration of the start of frame PID according to the USB standard.

The host transmits a start of frame packet (SOF packet) once per millisecond in order to define the ticks 74 represented in FIG. 7b. The SOF packet is represented in FIG. 7d and includes an SYNC field (not illustrated in FIG. 7d), an SOF-PID field 75, an 11-bit frame number (76) and a CRC check sum for the field 76 which is entered into a field 77. The frame number 76 is incremented by 1 with every additional SOF packet.

In FIG. 7a, for example, the synchronization pattern (SYNC pattern) preceding the PID field 75 of FIG. 7d is illustrated as an electric signal. It consists of a sequence of bits specified in the USB standard or of a data pattern, respectively, that looks as illustrated in FIG. 7a as an electric signal due to the NRZI encoding. The sequence of databits is 00000001, which leads to the "electric" sequence 10101011 shown in FIG. 7a. Before the synchronization data pattern an area designated by idle is located comprising with regard to the differential signals Dp and Dm a single-ended zero encoding (SE0 encoding), as it is discussed in the following. This SE0 encoding of the Dp and Dm signals indicates the end of the preceding frame and further indicates that now a new frame follows that is introduced by a synchronization field and is directly followed, as it is shown in FIG. 7a, by the packet identification number and in particular, as it is shown in FIG. 7c, a least significant bit of the PID and the next high-order bit of the PID, etc.

The notation shown in FIG. 7a illustrates that the bits are fixed in the synchronization pattern and that the associated electric signal can have the sequence of 10101011, while the PID bits may have both a 0 or a 1, depending on the packet identification to be encoded.

Every low-speed or full-speed data packet transmitted via the USB bus thus starts with a synchronization pattern (FIG. 7a) followed by the packet identification number (PID), as illustrated in FIG. 7c, which defines the packet type. The synchronization field includes a series of 0–1 transitions on the bus in order to enable a receiver to synchronize onto the bit clock.

As it is illustrated in FIG. 7, a frame interval of one millisecond is defined. The host transmits an SOF packet (start of frame packet) once per millisecond (FIG. 7b). The SOF packet consists of a synchronization field followed by the SOF-PID, an 11-bit frame number and a CRC 5-finger print (FIG. 7d). The frame number is incremented with every SOF packet sent.

When a device is connected to the USB bus, a startup sequence takes place. At the end of this sequence the device is driven into a reset state. After the reset event the device has a time period of 10 milliseconds in order to perform a reset recovery. During this time the device receives SOF packets.

Figure 9:
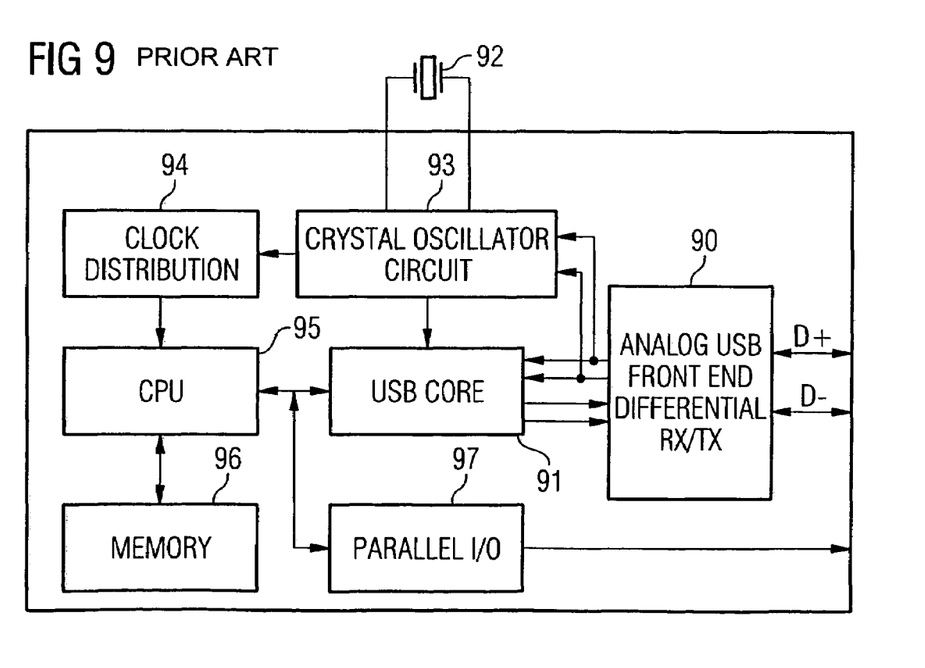
FIG. 9 shows a block diagram of a USB device having an external crystal oscillator.

A conventional USB device is schematically illustrated in FIG. 9. It includes an analog USB front end that may be integrated with a differential transmitter (TX) and a differential receiver (RX) in a functional unit 90. At one side of the element 90 the signals Dp and Dm are present in analog form, while at another side of the element 90 the corresponding received and analog/digital-converted signals are applied that are fed into a USB core 91 or are received from the same, respectively. These signals are illustrated in FIG. 9 by the two pairs of parallel signal arrows. The USB device further includes a crystal oscillator 92 connected to a crystal oscillator wiring 93, wherein the crystal oscillator wiring 93 on the one hand controls the USB core 91 and on the other hand a clock distribution 94 connected to a CPU 95 which is again in operational connection with a memory 96. Further, a USB device, depending on the application, also includes a parallel input/output interface (parallel I/O) 97.

Such conventional USB devices typically use a crystal oscillator 92 as a clock source for the system devices and the USB data recovery circuit, as it may be seen from FIG. 9. For robust portable devices, like e.g. chip cards, it would be desirable that they extract their own local clock directly from the USB data stream. For such devices the use of crystal oscillators is impractical, as crystals may usually not be integrated into a chip and are further very prone to damage due to mechanical loads. Chip cards are usually carried in rough environments, like e.g. in a purse carried in a trouser pocket. The thus exerted mechanical load would be fatal for a quartz crystal oscillator.

For synchronization applications in general, however also for other purposes, digitally controllable oscillators are required. Such digitally controllable oscillators normally include a controllable oscillator that generates an oscillation with a certain frequency depending on an analog input signal. If the analog input signal is increased or decreased, then typically also the frequency becomes higher or lower. In order to achieve a digital controllability the analog input of the controllable oscillators is connected to a digital/analog converter. By inputting a digital value into the digital/analog converter a certain analog output signal is generated which depends on the digital input signal.

What is disadvantageous about such a digitally controllable oscillator is that the digital/analog converter is always restricted to a certain bit width associated with a signal swing of the analog output signal which finally determines the controllability of the controllable oscillator. Controllable oscillators typically have a bottom frequency which is for example achieved when only zeros are input as a binary word in the digital/analog converter. The highest frequency of the controllable oscillator is achieved when as a binary word only ones are input into the digital/analog converter. The binary weighting that digital/analog converters generally have, and the requirement that a digital/analog converter must generate a maximum output signal and a minimum output signal that are adjusted to the control area of the oscillator, which consequently have to be selected so that the on the one hand the minimum frequency of the controllable oscillator and on the other hand the maximum frequency of the controllable oscillator are obtained, automatically results in a consequence with regard to the quantization of the frequency or the granularity of the frequency setting, respectively.

The quantization of the frequency setting is determined, i.e. the minimum increment by which the analog output signal of the digital/analog converter which is simultaneously the analog input signal in the controllable oscillator, and thus the frequency of the oscillator may be varied.

If the binary input word in the digital/analog converter is increased by a digital increment, then at the output of the digital/analog converter a difference in the analog output signal results which causes the frequency of the controllable oscillator to rise by a certain amount. As an example, the following situation results. If a binary input word of for example 1000 is increased in the digital/analog converter by a digital increment, i.e. by a change of the least significant bit (LSB), i.e. if instead of 1000 the binary value of 1001 is entered, then the analog output signal is higher by a certain differential value as, which leads to the fact that the frequency of the controllable oscillator again rises or falls by a certain frequency differential value σs.

This quantization may in some cases be too coarse, in particular when synchronization circuits are considered in which very slight frequency changes are required, as a very accurate synchronization is desired.

DE 10041772 C2 discloses a clock generator in particular for USB devices in which due to a synchronization signal periodically recurring in the data stream a pulse filter is controlled in order to reduce the frequency of a pulse train output by an internal clock generator by suppressing pulses in the effective frequency. Further, using the synchronization signal and a value stored in a pulse number storage or using an output signal of a data signal decoder, respectively, a frequency generated by the internal clock generator is re-tuned.

In order to increase this differential value, either the width of the digital/analog converter could be increased such that the same obtains a larger area of representable numbers. This is not desirable in some applications, however, as digital/analog converters in particular in integrated circuits are predetermined with regard to layout/design. On the other hand, the digital/analog converter could be reduced with regard to its supply or reference voltage, respectively, such that the maximum binary word leads to a lower maximum output signal and thus of course also to a lower as for a digital frequency increment. This option has the disadvantage, however, that then the maximum control range of the controllable oscillator may not be used any more, which is in particular disadvantageous when applications are present in which large frequency changes are caused by the system. Such scenes for example occur in frequency-hopping applications.

SUMMARY OF THE INVENTION

It is an object of the present invention to provide a more flexible digitally controllable oscillator.

The present invention provides a digitally controllable oscillator, having an oscillation generation means implemented to generate an oscillation having a frequency settable via an analog input signal into the oscillation generation means; and an oscillator control for generating the analog input signal, wherein the oscillator control has a first digital/analog converter for providing a first digital/analog converter output signal in response to a first digital input signal; a second digital/analog converter for providing a second digital/analog converter output signal in response to a second digital input signal; and a combiner for combining the first and the second digital/analog converter output signals in order to obtain the analog input signal for the oscillation generation means, wherein the second digital/analog converter is implemented in order to provide, in response to a digital increment in the second digital input signal, a difference in the second digital/analog converter output signal which is smaller than a difference in the first digital/analog converter output signal, when the first digital/analog converter is pulsed with the digital increment in the first digital input signal, wherein the first digital/analog converter and/or the second digital/analog converter are implemented in order to provide, in response to a digital increment, a difference in the first or the second output signal, respectively, depending on a supply quantity for the digital/analog converter, wherein the supply quantity for the second digital/analog converter is different from a supply quantity for the first digital/analog converter, and wherein the oscillator control comprises a third digital/analog converter connected to the second digital/analog converter so that it provides the supply quantity for the second digital/analog converter, wherein the supply quantity for the second digital/analog converter is settable via a digital input signal into the third digital/analog converter.

BRIEF DESCRIPTION OF THE DRAWINGS

Preferred embodiments of the present invention are explained in more detail in the following with reference to the accompanying drawings, in which.

DESCRIPTION OF THE PREFERRED EMBODIMENTS

The present invention provides a digitally controllable oscillator, having an oscillation generation means implemented to generate an oscillation having a frequency settable via an analog input signal into the oscillation generation means; and an oscillator control for generating the analog input signal, wherein the oscillator control has a first digital/analog converter for providing a first digital/analog converter output signal in response to a first digital input signal; a second digital/analog converter for providing a second digital/analog converter output signal in response to a second digital input signal; and a combiner for combining the first and the second digital/analog converter output signals in order to obtain the analog input signal for the oscillation generation means, wherein the second digital/analog converter is implemented in order to provide, in response to a digital increment in the second digital input signal, a difference in the second digital/analog converter output signal which is smaller than a difference in the first digital/analog converter output signal, when the first digital/analog converter is pulsed with the digital increment in the first digital input signal, wherein the first digital/analog converter and/or the second digital/analog converter are implemented in order to provide, in response to a digital increment, a difference in the first or the second output signal, respectively, depending on a supply quantity for the digital/analog converter, wherein the supply quantity for the second digital/analog converter is different from a supply quantity for the first digital/analog converter, and wherein the oscillator control comprises a third digital/analog converter connected to the second digital/analog converter so that it provides the supply quantity for the second digital/analog converter, wherein the supply quantity for the second digital/analog converter is settable via a digital input signal into the third digital/analog converter.

The present invention is based on the finding that the analog input signal in the controllable oscillator is not generated using a single digital/analog converter any more but at least using two digital/analog converters both providing an analog output signal which are combined at a combiner in order to obtain a resulting DAC output signal that is fed into the controllable oscillator or an oscillation generation means, respectively. In order to achieve a higher flexibility one of the two digital/analog converters is implemented in order to generate a difference in the digital/analog converter output signal of this converter in response to a digital increment in a digital input signal which is smaller than a difference in the output signal of the other digital/analog converter when the other digital/analog converter is pulsed with the preferably same digital increment.

In other words, the inventive concept allows a digital/analog converter, i.e. for the one that provides the greater difference in its output signal to a digital increment, to use the complete control range of the controllable oscillator. In connection with this the quantization of this digital/analog converter is relatively coarse. According to the invention, this disadvantage is removed by the fact, however, that a second digital/analog converter is provided having a finer quantization than the first digital/analog converter so that so to speak a coarse tuning may be achieved with the first digital/analog converter while a fine tuning may then be achieved by changing the digital input signal into the second digital/analog converter. Depending on the application, the quantization interval or the difference in the output signal of the second digital/analog converter, respectively, may be arbitrarily decreased.

This may be performed by the fact that the second digital/analog converter is supplied with a current from its own current source arranged separately from the current source for supplying the first digital/analog converter.

In one preferred embodiment of the present invention, however, the range setting of the second digital/analog converter is achieved by providing a third digital/analog converter which provides the supply signal for the second digital/analog converter on the output side. By inputting a digital value into the third digital/analog converter the control range of the second digital/analog converter and thus the difference in the output signal of the second digital/analog converter when applying a digital increment to the same may be finely tuned in a flexible and arbitrary way. The provision of a third digital/analog converter further enables two of the three digital/analog converters to be supplied by the same source which is advantageous in particular for integrated applications in which no arbitrary number of sources are available. Additionally, no power loss by current/voltage dividers has to be accepted.

In a preferred embodiment of the present invention, a completely integrable form without quartz oscillators is preferred as an oscillation generation means, like e.g. a chain with an odd number of inverters that are supplied by the resulting digital/analog converter output signal at the output of the combiner and generate another oscillation frequency depending on the value of this signal.

The digitally controllable oscillator according to the present invention is flexible in its control, on the one hand with regard to the maximum control range and on the other hand with regard to the smallest frequency increment that may be generated and may therefore be applied in almost any areas of use.

The inventive oscillator is in particular suitable for faster USB modes. Here, the synchronization field alone or the time duration of the synchronization field, respectively, is at least sufficient in order to achieve a coarse setting of an oscillator which is restrictedly free-running. The thus obtainable accuracy for the setting of the free-running oscillator is much too low, however, in order to perform a sensitive data extraction. It is, however, already sufficiently accurate in order to start with a coarse data recovery in order to decode the packet identification field following the synchronization field. According to the invention, the number of clock periods of the free-running oscillator is counted between two temporally consecutive packet identification fields and compared to a predetermined reference value.

The clock extraction is therefore based on the fact that although a time jitter is admitted for consecutive USB clocks of 12 ns or 20 ns, respectively, the accuracy for a frame interval, i.e. for the interval between two consecutive start of frame packet identifications in percent, is preset substantially tighter. Thus, in the USB standard a frame interval is defined to be 1 ms ±500 ns. This corresponds to a relative accuracy of 0.05%. According to the invention, consequently the frame period present with a high relative accuracy is used in order to obtain a fine tuning of the clock recovery oscillator.

At this point it is to be noted that the fine tuning on the basis of the frame period, i.e. the first data pattern in a preferred embodiment, is only performed after the coarse tuning on the basis of the synchronization field, as in the preferred embodiment a frame identification number decoding functions well after a coarse tuning took place.

The extraction concept is advantageous in so far that a two-step proceeding is used in which the fine tuning is based on the coarse tuning and thus enables a clock recovery also for devices operating with fast data rates, like e.g. the USB high-speed mode or the USB full-speed mode, without external quartz oscillators or expensive non-integrable resonators.

The extraction concept is further advantageous in so far that the use of simple and thus robustly operating algorithms is possible so that a simple and simultaneously robust implementation, e.g. on portable devices like chip cards, etc. is possible, which are also limited with regard to the computational power and with regard to the storage requirement per se.

Thus on the basis of a second data pattern present in the data stream that is preferably easily detectable a coarse tuning is performed, and on the basis of the first data patterns recurring in the data stream a fine tuning is performed, wherein the recurring first data patterns are present with a high accuracy, are, however, not so easily detectable as a second data pattern. Thus, a clock recovery is obtained with the high accuracy underlying the recurring first data pattern in the data stream, for the detection of which, however, a coarse tuning of the oscillator is used on the basis of the easily detectable, however inaccurately present second data pattern.

Figure 5:
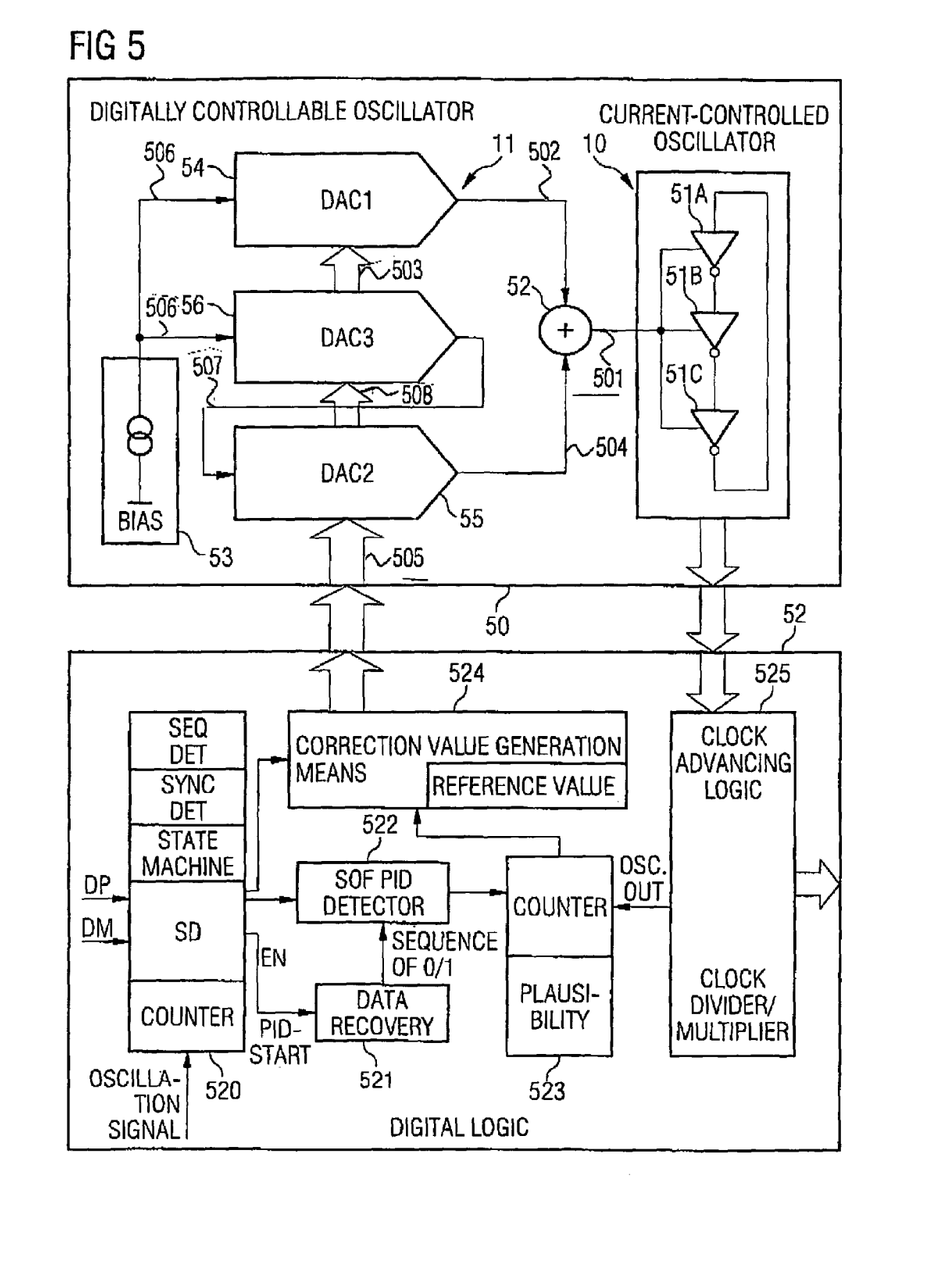
FIG. 5 shows a block diagram of an inventive device for extracting according to a preferred embodiment of the present invention.

At reference numeral 50, FIG. 5 shows a digitally controllable oscillator according to a preferred embodiment of the present invention. The digitally controllable oscillator includes an oscillation generation means 10 which is implemented in order to generate an oscillation having a frequency that may be set via an analog input signal in the oscillation generation means. The analog input signal into the oscillation generation means is illustrated by 501 in FIG. 5.

The digitally controllable oscillator further includes an oscillator control 11 for generating the analog input signal 501, wherein the oscillator control comprises a first digital/analog converter 54 for providing a first digital/analog converter output signal 502 in response to a first digital input signal 503. The oscillator control 11 further includes a second digital/analog converter 55 for providing a second digital/analog converter output signal 504 in response to a second digital input signal 505.

The oscillator control 11 further includes a combiner 52 for combining the first and the second digital/analog converter output signal 502, 504 in order to obtain the analog input signal 501 for the oscillation generation means.

According to the invention, the second digital/analog converter 55 is implemented in order to provide a difference in the second digital/analog converter output signal 504 in response to a digital increment in its input signal 505 which is smaller than a difference in the first digital/analog converter output signal 502 when the first digital/analog converter is pulsed with the digital increment in its digital input signal 503.

As it is shown in FIG. 5, the first and the second digital/analog converters 54 and 55 are supplied by a supply signal 506 or 507, respectively.

In a preferred embodiment of the present invention the supply signal for the second digital/analog converter 55 is generated by a third digital/analog converter 56 in which the third digital/analog converter 56 is pulsed with a certain third digital input signal 508. As it is shown in FIG. 5, the third digital/analog converter 56 is pulsed with the same supply signal 506 as the first digital/analog converter 54.

In the following, a preferred application of the inventive digitally controllable oscillator is presented in a device and a method for extracting a clock frequency underlying a data stream and in particular for recovering this clock frequency.

Figure 1:
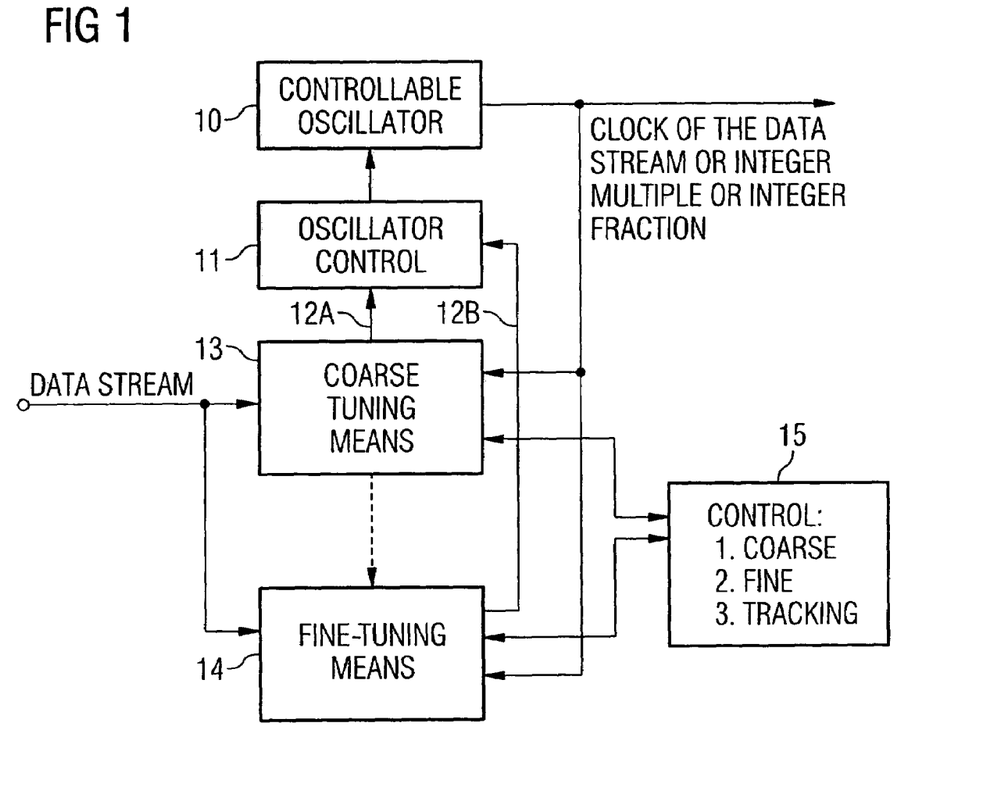
FIG. 1 shows a block diagram of an inventive device for extracting a clock frequency underlying a data stream.

FIG. 1 shows a device for extracting a clock frequency underlying a data stream, wherein the data stream comprises a first data pattern, like e.g. a start of frame packet identification number (SOF-PID), at regular first temporal intervals specified with a relative first accuracy, like e.g. 1 ms in an application for a USB data stream, and wherein the data stream further comprises a second data pattern (synchronization field) comprising a plurality of clock periods according to the clock frequency or a multiple of the clock frequency, wherein the clock periods are specified with a second relative accuracy which is smaller than the first relative accuracy.

The device is implemented in order to control a controllable oscillator 10, i.e. in order to provide an oscillator controller 11 with coarse-tuning signals on a line 12a or fine-tuning signals on a line 12b such that the oscillator controller 11 may feed a corresponding voltage signal to the controllable oscillator 10 depending on the implementation of the controllable oscillator in case of a VCO or a corresponding current signal in case of an ICO.

The device includes a coarse-tuning means 13 and a fine-tuning means 14. The coarse-tuning means is implemented in order to detect a beginning and an end of the second data pattern (synchronization field based on the example of the USB specification). The coarse-tuning means is further implemented in order to count a number of clock periods of the controllable oscillator 10 in a time period from the beginning to the end of the second data pattern. In addition to that, the coarse-tuning means is implemented, in order to control oscillator control 11 for oscillator controlling in the case in which the counted number is larger than a reference value, in order to decrease the oscillator clock frequency of the controllable oscillator 10, or to control the controllable oscillator in order to increase its oscillator clock frequency in the case in which the counted number is smaller than the reference value.

The fine-tuning means 14 is implemented analog to this. In contrast to the coarse-tuning means it does not detect the beginning and the end of the second data pattern, however, but the occurrence of a first data pattern in the data stream and a temporally subsequent occurrence of the first data pattern in the data stream.

The fine-tuning means is further implemented in order to count the number of clock periods of the oscillator 10 from an occurrence of the first data pattern up to a next occurrence of the first data pattern in order to then, depending on the position of the counted value with regard to a set reference value, control the oscillator control means 11 so that the oscillation frequency of the controllable oscillator 10 is increased or decreased, respectively.

Thus, an oscillator clock frequency with the relative second accuracy is obtained, i.e. the accuracy underlying the first data pattern that is directly equal to the clock underlying the data stream depending on the specific implementation or equal to a multiple of the clock underlying the data stream or equal to a fraction of the clock underlying the data stream. In particular, integer multiples, like e.g. the two-fold, three-fold, . . . n-fold are preferred, wherein n is an integer number. With regard to the fractions, also integral fractions are preferred, like e.g. ½, ⅓, ¼, . . . , 1/n, wherein n is also an integer number.

Figure 2:
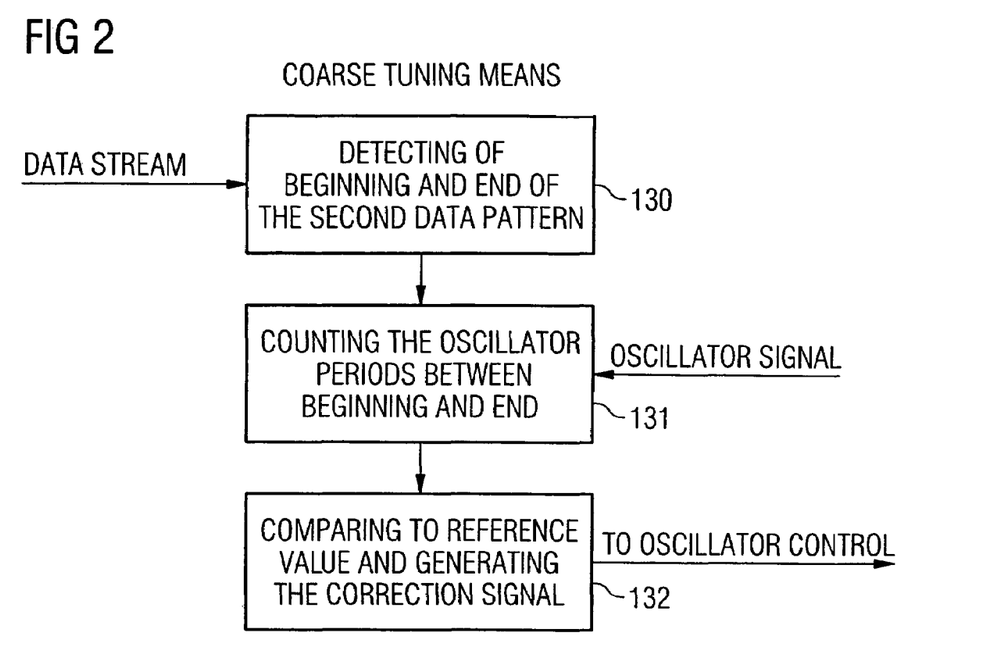
FIG. 2 shows a detailed block diagram of the coarse-tuning means of FIG. 1.

FIG. 2 shows a more detailed block diagram of the coarse-tuning means of FIG. 1. In particular, the coarse-tuning means 13 of FIG. 1 includes means 130 for detecting the beginning and the end of the second data pattern in the data stream, i.e. based on the example of the USB data stream e.g. the beginning of the synchronization pattern in the form of the first electric "1" and the end of the synchronization pattern in the form of the last electric "1" of the synchronization pattern of FIG. 7a. In the implementation, however, also only one part of the synchronization pattern of FIG. 7a may be used as a second data pattern, so that the second data pattern that is used for coarse-tuning purposes begins with the first electric "1" and ends with the seventh logic "0", such that only the alternating part of the synchronization pattern of FIG. 7a is used. Again alternatively, also merely depending on the ratio of the frequency of the controllable oscillator to the bit clock used in FIG. 7a, only one part of the alternating bit pattern may be used.

In response to means 130, means 131 for counting the oscillator periods between the beginning detected by means 130 and the end detected by means 130 is operated. In particular, by a counter activation signal output by means 130, when the same has detected the beginning of the second data pattern, a counter is started counting the clock periods of the oscillator signal fed to means 131 until the end is detected by means 130 or correspondingly until the counter stop signal is transmitted from means 130 to means 131.

The count may then be supplied from means 131 to means 132 which is implemented in order to compare the count to a reference value and in order to provide a corresponding correction signal that is transmitted to the oscillator control (means 11 of FIG. 1). The reference value used by means 132 depends on a nominal frequency of the oscillator 10 and on a temporal duration or on the number of regarded bits, respectively, of the synchronization pattern illustrated in FIG. 7a or of a part of the same. If the bit clock of the synchronization pattern in FIG. 7a is e.g. 12 megabits per second in the full-speed USB mode and if the nominal frequency of the controllable oscillator is for example 96 MHz, i.e. the eight-fold of the full-speed USB clock, and if the overall synchronization field, i.e. the 8 bit clocks for coarse tuning are used, then in this case the predetermined reference value will be 64. This means that in case of an optimum oscillator tuning the controllable oscillator 10 would have to provide 64 clocks during the duration of the synchronization pattern of FIG. 7a. If it provides less than 64 clocks, it is too slow. If it provides more than 64 clocks, however, it is too fast.

Figure 3:
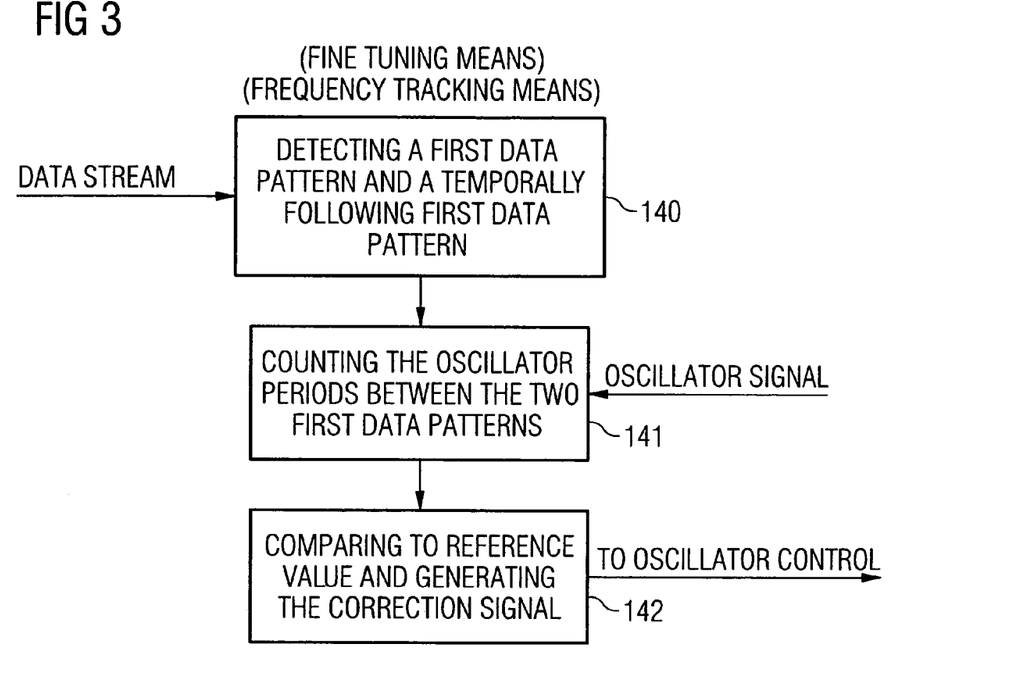
FIG. 3 shows a detailed block diagram of the fine-tuning means of FIG. 3.

FIG. 3 shows a more detailed block diagram of the fine-tuning means 14 of FIG. 1. The fine-tuning means 14 of FIG. 1 includes means 140 for detecting a first data pattern (an SOF-PID based on the example of the USB format) and a temporally subsequent first data pattern. When detecting a first data pattern a counter in means 141 for counting the oscillator periods in a first data pattern is activated which then, when a temporally subsequent first data pattern has been detected, is stopped again. The counter in means 141 is operable in order to count the clock periods of the controllable oscillator 10 of FIG. 1. The count value is then supplied to means 142 which is implemented in order to compare this count value to a reference value and to generate the correction signal supplied to the oscillator control 11 of FIG. 1.

Based on the example of a USB-specified data stream the temporal interval between two subsequent first data patterns is 1 ms, as it is shown in FIG. 7b. If the nominal frequency of the controllable oscillator 10 of FIG. 1 is again 96 MHz, then in this case the predetermined reference value would be 96,000, i.e. 96,000 oscillator cycles would have to occur in the time period of 1 millisecond, so that the oscillator is set correctly. If the count value is larger than 96,000, the oscillator frequency has to be reduced. If the count value is smaller than 96,000, however, the oscillator frequency has to be increased.

The fine-tuning means shown in FIG. 3 may further be used as a frequency-following means after both the coarse tuning and also the fine tuning are completed and the accuracy or the frequency-following capability, respectively, of the oscillator is to be further increased, as it is explained in the following.

Figure 4:
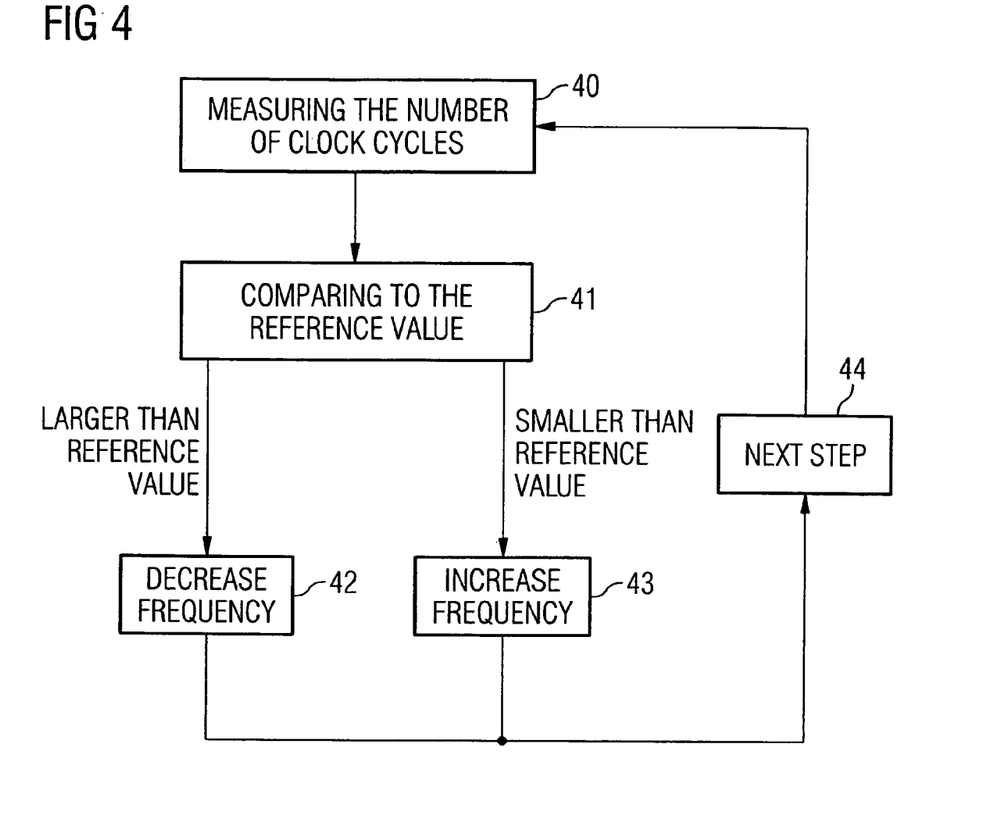
FIG. 4 shows a block diagram of the concept for an iterative coarse or fine tuning, respectively, according to a preferred embodiment of the present invention.

Means 132 of FIG. 2 or 142 of FIG. 3, respectively, are preferably implemented in order to operate iteratively, as it is explained in the following with reference to FIG. 4. The iterative proceeding consists of first measuring the number of clock cycles by means 130 or 140, respectively (40), in order to then compare the measured number to a reference value (41). If the comparison result is such that the number of clock cycles is larger than the reference value, then the frequency is decreased (42). If it is determined, however, that the measured number of clock cycles is smaller than the reference value, then the frequency of the oscillator has to be increased (43). Then an iteration variable is incremented or a next step 44 is entered, respectively, in which it is now checked again whether the frequency increased or decreased in the last step is again too high or too low.

As an iteration strategy or as an increment value, respectively, using which the frequency is increased or decreased, respectively, from one step to the next, different strategies may be used. According to the invention it is preferred to use a concept in which the increment amount, by which the frequency is changed from one step to the next, i.e. is increased or decreased, respectively, changes from step to step and in particular decreases from step to step. For this, it is preferred to use a method of successive approximation which is explained in more detail later with reference to FIG. 6.

Here, the 1 ms frame interval for setting the frequency of the free-running oscillator is used. Within 10 frame intervals the frequency accuracy of the oscillator is within the specified range of 0.25%. For this, as it has been implemented, a tuning of the oscillator in two sections is performed, i.e. first in a coarse-tuning section and then in a fine-tuning section.

For coarse tuning the number of oscillator periods between a certain number of SYNC field bits is counted and compared to a reference value. When the counter value is larger than the reference value, the oscillator frequency is too high and is decreased. If, however, the counter value is smaller than the reference value, then the oscillator frequency is too low and is increased. If the number of coarse-tuning steps is equal to C, if the reference value is designated by CR and if the counter value is designated by CC, and if finally the frequency of the oscillator is ν, then the coarse-tuning algorithm may generally be illustrated as follows:
1. determining $CC_c(\nu_{c-1})$
2. $CC_c > CR: \nu_c = \nu_{c-1} - \Delta\nu_c$
   $CC_c < CR: \nu_c = \nu_{c-1} + \Delta\nu_c$ etc.
3. determining $CC_{c+1}(\nu_c)$ After a certain small number of coarse-tuning steps the measurement on the basis of SYNC bits may not further improve the accuracy of the oscillator frequency. Now the fine tuning begins.

For fine tuning the number of oscillator periods between SOF packets is counted and an algorithm which is similar to the coarse-tuning algorithm is used. If the fine-tuning step number is F, the reference value is FR and the counter value is FC and the frequency of the oscillator is ν again, the fine-tuning algorithm results as follows:
(a) determining $FC_F(\nu_{F-1})$
(b) $FC_F > FR: \nu_F = \nu_{F-1} - \Delta\nu_{VF}$
    $FC_F < FR: \nu_F = \nu_{F-1} + \Delta\nu_F$ etc.
(c) determining $FC_{F+1}(\nu_F)$ As the time between consecutive SOF packets is accurate to ±500 ns, an accuracy of the set frequency of 0.05% (500 ppm) is achieved.

The frequency of the oscillator after tuning the same is determined by the reference value FR. If the desired oscillator frequency is for example 96 MHz, then the reference value FR has to be 96,000, if consecutive SOF packets are regarded. If not directly consecutive SOF packets are regarded but e.g. two-fold or three-fold consecutive SOF packets, respectively, then the reference value is correspondingly higher. In case of halves, thirds, fourths, . . . of the period duration between SOF packets the reference value is correspondingly lower.

The inventive two-step concept enables obtaining an one the one hand fast and on the other hand accurate frequency setting. For USB applications only one startup time of about 10 ms exists in which a new communication subscriber has to be ready. If the subscriber is not ready within this time, an error signal results. Only based on the fine tuning this time is usually not sufficient as there are only 10 consecutive SOF-PIDs in the startup time of 10 ms.

On the other hand, the coarse tuning alone is fast, but too inaccurate, as the synchronization pattern is too inaccurate in the data stream.

According to the invention, thus the coarse tuning is for example performed with the first synchronization pattern, so that in the startup time of 10 ms enough consecutive events remain in the data stream (e.g. SOF-PIDs) so that a secure and accurate tuning of the now coarsely tuned oscillator is achieved.

As it was already illustrated with reference to FIG. 3, after the fine tuning in a preferred embodiment of the present invention, a frequency-following algorithm takes place further setting the oscillator frequency. Like in the fine-tuning algorithm, the number of oscillator periods between SOF packets present in the data stream is measured.

Figure 8:
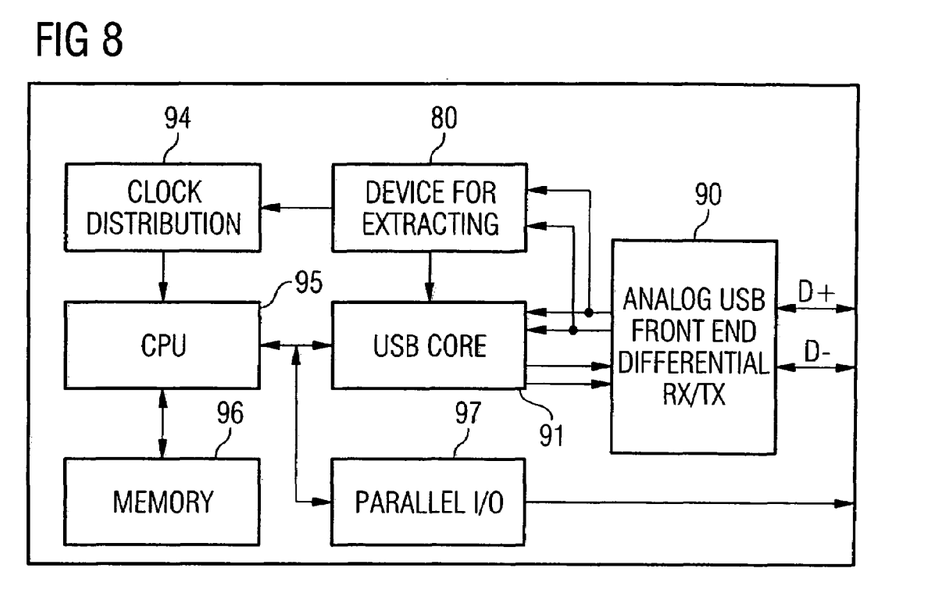
FIG. 8 shows a block diagram of a USB device having an inventive device for extracting.

The oscillator clock obtained after coarse tuning and after fine tuning may for example be used as a reference clock for a USB core. For this, reference is made to FIG. 8, in which the inventive device for extracting is illustrated, designated by 80. The inventive device for extracting therefore has, together with a controllable oscillator, the functionality of blocks 92 and 93 of the known USB functional circuit which was explained with reference to FIG. 9.

It is to be noted that a phase locking between the oscillator clock and the bit clock of the USB data stream is not necessary because the oscillator clock frequency is generally a multiple of the bit clock frequency and an oversampling and digital PLLs may be used for the data recovery.

The device is advantageous in so far that for data streams having an underlying fast clock, like e.g. for full-speed USB data streams and high-speed USB data streams, no crystal oscillator is required. Of course, also for slower-clocked data streams no external oscillators are required.

The device is further advantageous in so far as the regenerated frequency is obtained with a high accuracy determined by the accuracy with which the first data pattern is present in the data stream. Based on the example of the USB application an accuracy of 0.05% is achieved.

In the following, with reference to FIG. 5, a preferred embodiment of the present invention is illustrated schematically. FIG. 5 shows a clock regeneration circuit basically consisting of two main units. One of them is the digitally controllable oscillator 50 comprising on the one hand an oscillator control 11 and on the other hand the controllable oscillator 10 which is a current-controlled oscillator in FIG. 5.

FIG. 5 further shows a digital logic 52 including the coarse-tuning means 13 and the fine-tuning means 14 as it is illustrated in the following.

The current-controlled oscillator 10 is, in the preferred embodiment shown in FIG. 5, a current-controlled ring oscillator with an odd number of chained inverters 51a, 51b, 51c that are supplied with an operating current from a current sum node 52 via which an oscillation frequency of the current-controlled oscillator 10 may be set.

Apart from the current sum node 52 the oscillator control means 11 includes a supply current source or a reference current source 53, respectively, providing a central reference (there is typically additionally an individual bias present), a first digital/analog converter 54, a second digital/analog converter 55 and a third digital/analog converter 56. The digital/analog converters 54, 55, and 56 of FIG. 5 are implemented in order to provide a current on the output side which is a fraction of the supply current supplied on the input side, wherein the selection of the fraction is performed via a binary number supplied to the digital/analog converter via a digital input. Preferably, binarily weighted circuits 54, 55 and 56 are preferred. For example, the DAC 1 (54) provides the value of the supply current 53 at its output to current summation nodes 52 when all bits of the binary number supplied to the same are set. If, however, only the MSB of the DAC 1 (54) is set while all bits having a lower order are equal to 0, then the DAC 1 provides half of the current supplied from the source 53 to the current summation node on the output side. According to the invention, 9-bit-DACs are preferred, although in this implementation also DACs with a higher or lower width, respectively, may be used.

It is to be noted that as an oscillation generation means also fully differential ring oscillators with an even number of differential inverters may be used. In this case, a phase shift of 180 degrees by the exchanging of N output and P output during the feedback to the input is achieved.

As it may be seen from FIG. 5, the DAC 1 54 is directly supplied from the current supply 53. It may thus provide the maximum current amount on the output side. The DAC 1, in a preferred embodiment of the present invention, is set by coarse tuning and fine tuning. In particular, the higher-order bits of the DAC 1 are set by coarse tuning while the lower-order bits of the DAC 1 are set by fine tuning. The DAC 2 55 is used for a frequency tracking. Its supply current and thus the oscillator control current that may at maximum be provided from the same to the current summation node 52 is controllable by the DAC 3 56. If the DAC 3 56 is controlled by a binary value in which all bits are set, then the output current of the DAC 3 56 is equal to the supply current 53 which directly causes that the DAC 2, when it is also pulsed with ones only, may supply the same current to the summation node 52. According to the invention it is preferred, however, to pulse the DAC 3 with a binary number that is smaller than the binary number that may at maximum be pulsed, in order to reduce the maximum current that is supplied by the DAC 2 55 to the current summation node 52. This reduced maximum current may then, due to the fact that the DAC 2 55 may also be pulsed for example with 9 bits, be divided finer in order to be able to perform a frequency tracking for which the DAC 2 55 is used with a finer accuracy as it is determined by the LSB of the DAC 1. Generally speaking, the granularity of the current output by the DAC 2 is inversely proportional to the operational current supplied to the DAC 2. The smaller the operational current supplied to the DAC 2 (set by the DAC 3) the finer the granularity in the frequency-tracking mode following after the fine-tuning mode.

The digitally controllable oscillator 11 thus includes a supply source 53, the current-controlled ring oscillator 10 and the three DACs 54, 55 and 56. The DACs that are controlled by the digital logic 52 provide the control current for the frequency setting of the current-controlled oscillator ICO 10. The overall current for the ICO is the sum of the currents that are supplied from the two DACs 54 and 55. The areas of the digital/analog converters 1 and 2 are preferably overlapping. It is preferred that the maximum output current of the DAC 1 be a programmable multiple (programmable by the DAC 3) of the maximum output of the DAC 2. Preferably, a factor 4 is used.

At this point it is further noted that during the coarse-tuning mode and the fine-tuning mode the DAC 3 56 is pulsed such that the supply current in the DAC 2 is smaller by the programmable multiple than the supply current in the DAC 1. In addition, it is preferred, that during coarse tuning and fine tuning the MSB of the DAC 2 is set and/or all other bits of the DAC 2 are not set. The DAC 2 thus provides half of the overall possible maximum output current to the current summation node 52. If then all bits of the DAC have been set by the coarse-tuning mode and the fine-tuning mode, then by an additional setting of bits of the DAC 2 having a lower order than the MSB of the same, the current may be increased. If the current in the fine-tuning mode is to be reduced, however, then the MSB of the DAC 2 is reset and as required the bits of a lower order are set or not set. By the fact that during the coarse-tuning mode and the fine-tuning mode the MSB of the DAC 2 is set, it is guaranteed that in the frequency-tracking mode following after the fine-tuning mode the supply current for the current-controller oscillator may both be increased and decreased.

The digital logic 52 in FIG. 5 includes the following basic functional blocks. First of all, the circuit includes a synchronization field detector 520 also designated by SD in FIG. 5. The digital logic further includes a data recovery block 521, a start of frame packet identification detector (SOF-PID detector) 522, an oscillator clock cycle counter 523, a digital oscillator control logic 524 also referred to as correction value generation means in FIG. 5, and further a block 525 designated as clock advancing logic and clock divider/multiplier.

The synchronization field detector 520 includes an SE0 detector, a synchronization detector, a state machine and its own counter. The block 520 is connected to the differential signals Dp and Dm of the USB bus. The block 520 is operable in order to intercept signals on the bus and to thus monitor the bus traffic in order to, using the SE0 detector, detect certain bus conditions, like e.g. the presence of "single ended zero". In the SE0 mode both Dp and also Dm are on the same state, like e.g. high. As Dp and Dm are actually differential signals per definition, the SE0 state is actually a forbidden state which contains no expressive useful data. According to the USB specification, a state SE0 is used only, however, when the end of a packet has been achieved. The SE0 detector thus detects the end of a preceding packet and thus also the beginning of a synchronization field which the synchronization detector then detects in response to the SE0 detector. After an SE0 condition has been detected in block 520, the state machine is activated in block 520 in order to wait for the reception of a synchronization pattern, as it is illustrated in FIG. 7a. The counter in block 520 measures the length of the synchronization pattern by counting the number of oscillator periods between the beginning and the end of the synchronization field.

The data recovery block 521 is enabled by block 520 via the line designated by EN after the block 520 received a valid synchronization pattern. The data recovery unit 521 is then disabled again when the block 520 receives a state SE0. In addition to that, the measurement result of block 520 is fed to block 521 with regard to the length of the synchronization field which then uses this information in order to extract "zeros" and "ones" from the serial USB data stream, i.e. to decode the data stream or to recover information contained within the data stream, respectively. Always when a valid "0" or a valid "1" has been detected by block 521, the same is signalized at the output of block 521 such that block 521 provides a sequence of zeros and ones, respectively.

The start of frame packet identification detector 521 also referred to as SOF token detector examines the serial data stream of block 521 and signalizes the counter 523 when it has detected a start of frame packet identification number (SOF-PID).

The oscillator clock cycle counter 523 counts the number of DCO periods between the reception of consecutive SOF tokens. In addition, the counter 523 includes a plausibility examination means which examines whether SOF tokens were missed. The plausibility examination means is implemented in order to compare a coarse count value to a current count value. If the current count value exceeds the coarse count value by a very high amount, this indicates that at least one SOF-PID between the two detected SOF-PIDs was missed. In this case, the counter 523 is controlled in so far that this count value is not made available for means 522, as this would lead to a severe wrong setting of the controllable oscillator. Instead, this count value is marked as not plausible and is discarded.

The correction value generation means 524 then performs the frequency tuning and the frequency tracking. After a reset the frequency-tuning algorithm is active. First of all, the frequency of the oscillator is coarsely tuned. For a coarse tuning the cycle number of the synchronization pattern is used which was measured by block 520. The coarse tuning determines the most significant bits of the DAC 1, as it has been discussed. With every tuning step the low-order bits are gradually determined. After a certain number C of coarse-tuning steps, wherein with a bit width of the DAC 1 of 9 three steps are preferred for the coarse tuning, the fine-tuning algorithm starts, activated by a control means illustrated in FIG. 1 which controls the step sequence of coarse tuning, fine tuning and frequency tracking in principle.

If the width of the DAC 1 is D1 bits, the number of fine-tuning steps is D1-C.

As it has been explained, after fine tuning frequency tracking takes place. Like with the fine-tuning algorithm, also with frequency tracking the cycle count value of counter 521 is used in order to further set the oscillator frequency via the DAC 2 55.

Figure 6:
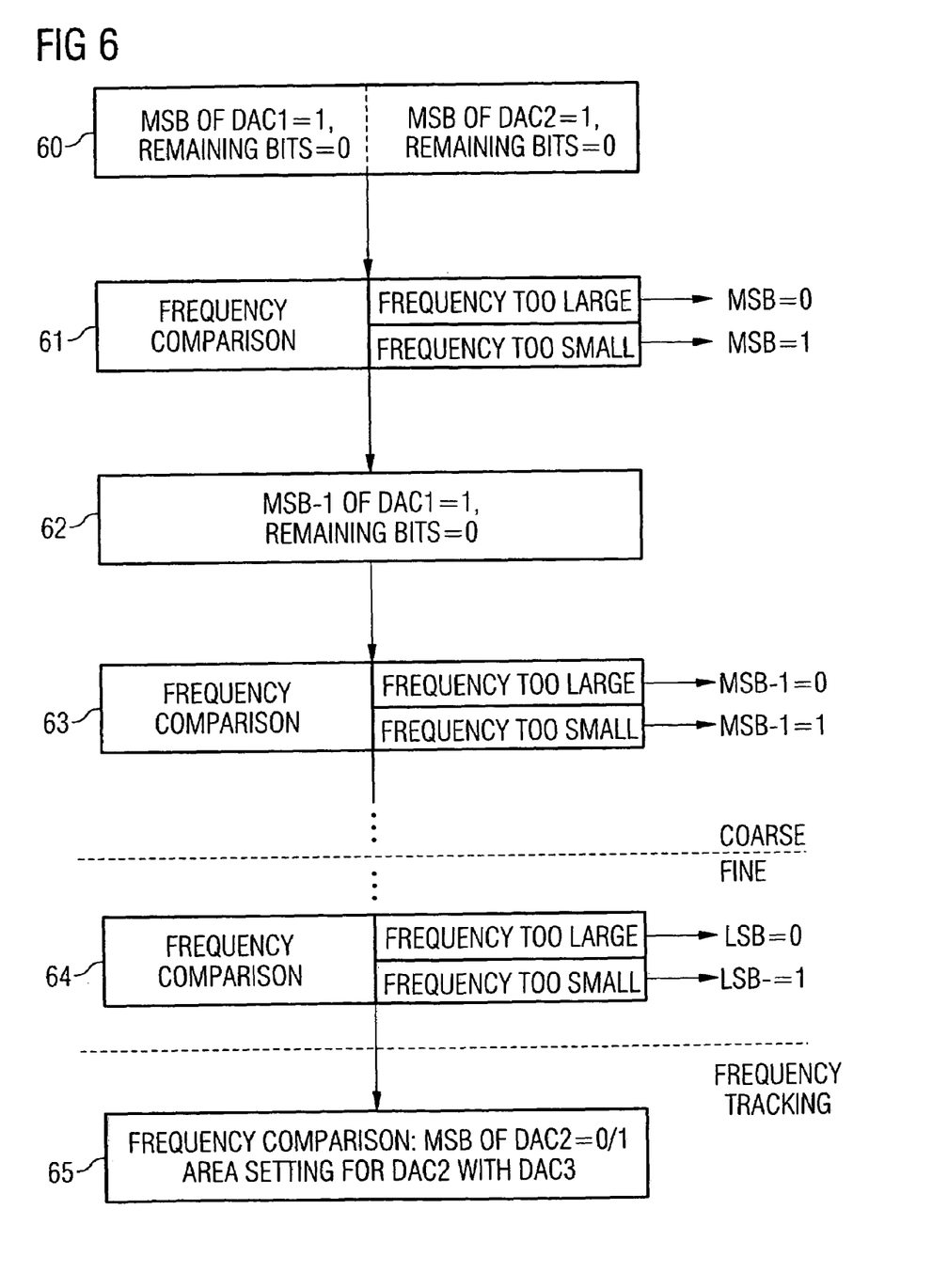
FIG. 6 shows a flowchart for explaining the iteration method used in the embodiment illustrated in FIG. 5.

In the following, reference is made to FIG. 6 in order to illustrate the functionality of the correction value generation means 524 in more detail.

In a first step 60 the most significant bit of the DAC 1 is set to 1 while the remaining bits are set to 0. The MSB of the DAC 2 is then also set during the whole coarse and fine tuning while the remaining bits of the DAC 2 are equal to 0. In a step 61 means 524 performs a frequency comparison using the input values of block SD 520 for coarse tuning or of the counter 523 for fine tuning. If the frequency is too high, the MSB of the DAC 1 is set to 0. If the frequency is too low, however, the MSB of the DAC 1 remains at 1. Then, means 524 is operable in order to set the MSB-1 of the DAC 1 to 1 in a step 62 after the MSB is such as it was determined in step 61.

In a step 63 means 524 is operable again in order to perform a frequency comparison. If the frequency is too high, then the bit MSB-1 of the DAC 1 is reset to 0. If the frequency is too low, however, the bit MSB-1 of the DAC 1 remains at its set value, i.e. at 1. This manner of the successive iterative approximation is continued until a corresponding predetermined number of bits of the DAC 1 is set. Then, by the control 15 of FIG. 1, the correction value generation means 524 is activated in order to go from the coarse-tuning mode into the fine-tuning mode and to now operate not based on the count values of block 520 but based on the count values of block 523 in order to gradually calculate the remaining bits of the DAC 1 in the fine-tuning mode.

When finally all bits of the DAC 1 have been calculated (64), a switch into the frequency-tracking mode (65) is performed in which the bits of the DAC 2 are correspondingly set. If it is determined in the last step 64 of the fine-tuning mode that the frequency was too low, this indicates that the MSB of the DAC 2 which was set to 1 at the beginning in step 60 is rightly at 1. If, however, it is determined in the last step 64 of the fine-tuning mode that the frequency is too high, the MSB of the DAC 2 is set to 0 and the successive approximation with the MSB-1 of the DAC 2 is performed gradually. Depending on the implementation, the DAC 3 may be reprogrammed at certain points of time in order to set the maximum output current and thus the granularity of the DAC 2 or to adjust to changing conditions, respectively.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A digitally controllable oscillator, comprising:
an oscillation generator implemented to generate an oscillation having a frequency settable via an analog input signal into the oscillation generator; and
an oscillator control for generating the analog input signal, wherein the oscillator control comprises:
  a first digital/analog converter for providing a first digital/analog converter output signal in response to a first digital input signal;
  a second digital/analog converter for providing a second digital/analog converter output signal in response to a second digital input signal;
  a combiner for combining the first and the second digital/analog converter output signals in order to obtain the analog input signal for the oscillation generator,
  wherein the second digital/analog converter is implemented in order to provide, in response to a digital increment in the second digital input signal, a difference in the second digital/analog converter output signal which is smaller than a difference in the first digital/analog converter output signal, when the first digital/analog converter is pulsed with the digital increment in the first digital input signal,
  wherein the first digital/analog converter and/or the second digital/analog converter are implemented in order to provide, in response to a digital increment, a difference in the first or the second output signal, respectively, depending on a supply quantity for the respective digital/analog converter, and
  wherein the supply quantity for the second digital/analog converter is different from a supply quantity for the first digital/analog converter, and
  a third digital/analog converter connected to the second digital/analog converter so that it provides the supply quantity for the second digital/analog converter, wherein the supply quantity for the second digital/analog converter is settable via a digital input signal into the third digital/analog converter.

2. The digitally controllable oscillator according to claim 1, wherein the first digital/analog converter and/or the second digital/analog converter are implemented in order to provide, in response to a digital increment, a difference in the first or the second output signal, respectively, depending on a supply quantity for the respective digital/analog converter.

3. The digitally controllable oscillator according to claim 1, wherein the oscillator control further comprises:
a supply source for supplying a supply quantity,
wherein the first and the third digital/analog converters are provided by the supply source with the same supply quantity, and
wherein the second digital/analog converter is supplied with a supply quantity smaller than the supply quantity for the first and the third digital/analog converters, wherein the supply quantity for the second digital/analog converter is settable by the digital input signal into the third digital/analog converter.

4. The digitally controllable oscillator according to claim 1, wherein the first, the second and the third digital/analog converters are implemented identically.

5. The digitally controllable oscillator according to claim 1, wherein the first, the second and the third digital/analog converters are integrated on a circuit.

6. The digitally controllable oscillator according to claim 1,
wherein the oscillation generator comprises an odd number of inverters connected in a ring, wherein the inverters may be supplied by the analog input signal.

7. The digitally controllable oscillator according to claim 1, wherein the first and the third digital/analog converter output signal and the analog input signal are currents.

8. The digitally controllable oscillator according to claim 1, wherein the digital increment includes a change of a binary word, that may be supplied to the first and the second digital/analog converters as input signals, by one bit.

9. The digitally controllable oscillator according to claim 1,
wherein the first digital/analog converter is controllable in a tuning mode and wherein the second digital/analog converter is controllable in a frequency-tracking mode,
wherein in the frequency-tracking mode the first digital/analog converter is pulsed with a constant digital input signal, and
wherein in the tuning mode the second digital/analog converter is pulsed with a constant second digital input signal.

10. The digitally controllable oscillator according to claim 9, wherein the second digital input signal in the second digital/analog converter in the tuning mode is selected so that after terminating the tuning mode in the frequency-tracking mode by changing the digital input signal in the second digital/analog converter the analog input signal may be changed in the oscillation generator into larger and into smaller values.

11. The digitally controllable oscillator according to claim 9,
wherein the second digital/analog converter in the tuning mode in which the first digital/analog converter may be pulsed in a variable way with a digital input signal in which a most significant bit is set and any low-order bits are not set so that the second digital/analog converter output signal has a quantity which is about half of a quantity of the maximum obtainable output signal of the second digital/analog converter.

12. The digitally controllable oscillator according to claim 1, wherein the first and/or the second digital/analog converter may be pulsed on the input side with a binary number of a width of n bits,
wherein the first and/or the second digital/analog converter may be supplied with an electric input quantity,
wherein a control quantity supplied on the output side by the respective digital/analog converter may be supplied to the combiner, and
wherein an amount of the electric control quantity is equal to a ratio determined by the binary number and the electric input quantity.

13. A digitally controllable oscillator, comprising:
an oscillation generating means implemented to generate an oscillation having a frequency settable via an analog input signal into the oscillation generating means; and
an oscillator control means for generating the analog input signal, wherein the oscillator control means comprises:
a first digital/analog converting means for providing a first digital/analog converting means output signal in response to a first digital input signal;
a second digital/analog converting means for providing a second digital/analog converting means output signal in response to a second digital input signal;
a combining means for combining the first and the second digital/analog converting means output signals in order to obtain the analog input signal for the oscillation generating means,
wherein the second digital/analog converting means is implemented in order to provide, in response to a digital increment in the second digital input signal, a difference in the second digital/analog converting means output signal which is smaller than a difference in the first digital/analog converting means output signal, when the first digital/analog converting means is pulsed with the digital increment in the first digital input signal,
wherein the first digital/analog converting means and/or the second digital/analog converting means are implemented in order to provide, in response to a digital increment, a difference in the first or the second output signal, respectively, depending on a supply quantity for the respective digital/analog converting means, and
wherein the supply quantity for the second digital/analog converting means is different from a supply quantity for the first digital/analog converting means, and
a third digital/analog converting means connected to the second digital/analog converting means so that it provides the supply quantity for the second digital/analog converting means, wherein the supply quantity for the second digital/analog converting means is settable via a digital input signal into the third digital/analog converting means.

14. The digitally controllable oscillator according to claim 13, wherein the first digital/analog converting means and/or the second digital/analog converting means are implemented in order to provide, in response to a digital increment, a difference in the first or the second output signal, respectively, depending on a supply quantity for the respective digital/analog converting means.

15. The digitally controllable oscillator according to claim 13, wherein the oscillator control means further comprises:
a supply means for supplying a supply quantity,
wherein the first and the third digital/analog converting means are provided by the supply means with the same supply quantity, and
wherein the second digital/analog converting means is supplied with a supply quantity smaller than the supply quantity for the first and the third digital/analog converting means, wherein the supply quantity for the second digital/analog converting means is settable by the digital input signal into the third digital/analog converting means.

16. The digitally controllable oscillator according to claim 13, wherein the first, the second and the third digital/analog converting means are implemented identically.

17. The digitally controllable oscillator according to claim 13, wherein the first, the second and the third digital/analog converting means are integrated on a circuit.

18. The digitally controllable oscillator according to claim 13, wherein the oscillation generating means comprises an odd number of inverters connected in a ring, wherein the inverters may be supplied by the analog input signal.

19. The digitally controllable oscillator according to claim 13, wherein the first and the third digital/analog converting means output signal and the analog input signal are currents.

20. The digitally controllable oscillator according to claim 13, wherein the digital increment includes a change of a binary word, that may be supplied to the first and the second digital/analog converting means as input signals, by one bit.

21. The digitally controllable oscillator according to claim 13,
wherein the first digital/analog converting means is controllable in a tuning mode and wherein the second digital/analog converting means is controllable in a frequency-tracking mode,
wherein in the frequency-tracking mode the first digital/analog converting means is pulsed with a constant digital input signal, and
wherein in the tuning mode the second digital/analog converting means is pulsed with a constant second digital input signal.

22. The digitally controllable oscillator according to claim 21, wherein the second digital input signal in the second digital/analog converting means in the tuning mode is selected so that after terminating the tuning mode in the frequency-tracking mode by changing the digital input signal in the second digital/analog converting means the analog input signal may be changed in the oscillation generating means into larger and into smaller values.

23. The digitally controllable oscillator according to claim 21,
wherein the second digital/analog converting means in the tuning mode in which the first digital/analog converting means may be pulsed in a variable way with a digital input signal in which a most significant bit is set and any low-order bits are not set so that the second digital/analog converting means output signal has a quantity which is about half of a quantity of the maximum obtainable output signal of the second digital/analog converting means.

24. The digitally controllable oscillator according to claim 13, wherein the first and/or the second digital/analog converting means may be pulsed on the input side with a binary number of a width of n bits,
wherein the first and/or the second digital/analog converting means may be supplied with an electric input quantity,
wherein a control quantity supplied on the output side by the respective digital/analog converting means may be supplied to the combining means, and
wherein an amount of the electric control quantity is equal to a ratio determined by the binary number and the electric input quantity.

* * * * *

UNITED STATES PATENT AND TRADEMARK OFFICE
CERTIFICATE OF CORRECTION

PATENT NO.        : 7,081,583 B2
APPLICATION NO.   : 11/166685
DATED             : July 25, 2006
INVENTOR(S)       : Patrizia Greco et al.

It is certified that error appears in the above-identified patent and that said Letters Patent is hereby corrected as shown below:

Column 4, line 8, "value as" should read --value σs--;

Column 4, line 34, "lower as" should read --lower σs--; and

Column 11, line 48, "$FC_F > FR : v_F = v_{F-1} - \Delta v_{vF}$" should read --$FC_F > FR : v_F = v_{F-1} - \Delta v_F$--.

Signed and Sealed this

Seventeenth Day of October, 2006

JON W. DUDAS
*Director of the United States Patent and Trademark Office*